(12) United States Patent
Yap et al.

(10) Patent No.: US 9,281,284 B2
(45) Date of Patent: Mar. 8, 2016

(54) SYSTEM-IN-PACKAGES HAVING VERTICALLY-INTERCONNECTED LEADED COMPONENTS AND METHODS FOR THE FABRICATION THEREOF

(71) Applicants: Weng F. Yap, Chandler, AZ (US); Zhiwei Gong, Chandler, AZ (US)

(72) Inventors: Weng F. Yap, Chandler, AZ (US); Zhiwei Gong, Chandler, AZ (US)

(73) Assignee: FREESCALE SEMICONDUCTOR INC., Austin, TX (US)

(*) Notice: Subject to any disclaimer, the term of this patent is extended or adjusted under 35 U.S.C. 154(b) by 0 days.

(21) Appl. No.: 14/310,992

(22) Filed: Jun. 20, 2014

(65) Prior Publication Data
US 2015/0371960 A1 Dec. 24, 2015

(51) Int. Cl.
| | | |
|---|---|---|
| H01L 23/58 | (2006.01) | |
| H01L 23/66 | (2006.01) | |
| H01L 21/768 | (2006.01) | |
| H01L 23/31 | (2006.01) | |
| H01L 23/538 | (2006.01) | |
| H01L 23/00 | (2006.01) | |
| H01L 21/52 | (2006.01) | |
| H01L 23/552 | (2006.01) | |

(52) U.S. Cl.
CPC .............. *H01L 23/66* (2013.01); *H01L 21/52* (2013.01); *H01L 21/76802* (2013.01); *H01L 21/76879* (2013.01); *H01L 21/76882* (2013.01); *H01L 23/3107* (2013.01); *H01L 23/5384* (2013.01); *H01L 23/552* (2013.01); *H01L 24/03* (2013.01); *H01L 24/09* (2013.01); *H01L 2223/6622* (2013.01); *H01L 2223/6677* (2013.01); *H01L 2224/02372* (2013.01)

(58) Field of Classification Search
CPC ................ H01L 23/481; H01L 23/488; H01L 23/49827; H01L 25/16
USPC ......................................................... 257/698
See application file for complete search history.

(56) References Cited

U.S. PATENT DOCUMENTS

| | | | | |
|---|---|---|---|---|
| 5,386,627 | A * | 2/1995 | Booth ............... | H01L 23/49827 216/18 |
| 5,498,902 | A * | 3/1996 | Hara ............................. | 257/686 |
| 6,724,638 | B1 * | 4/2004 | Inagaki et al. ................ | 361/763 |
| 7,368,813 | B2 * | 5/2008 | Wakisaka et al. ............ | 257/690 |
| 7,847,413 | B2 * | 12/2010 | Akiba et al. .................. | 257/777 |
| RE43,380 | E * | 5/2012 | Wakisaka et al. ............ | 257/690 |
| 8,581,334 | B2 * | 11/2013 | Lim .................. | H01L 21/76898 257/330 |
| 8,653,637 | B2 * | 2/2014 | Kim et al. ..................... | 257/686 |
| 8,853,849 | B2 * | 10/2014 | Otremba et al. .............. | 257/698 |

(Continued)

*Primary Examiner* — Allan R Wilson
(74) *Attorney, Agent, or Firm* — Ingrassia Fisher & Lorenz, P.C.

(57) ABSTRACT

System-in-Packages (SiPs) and methods for producing SiPs are provided. In one embodiment, the above-described SiP fabrication method includes the step or process of forming a through-hole in a core package, the core package containing an electrically-conducive routing feature exposed at a sidewall surface of the through-hole. A leaded component is positioned adjacent the core package such that an elongated lead of the leaded component extends into the through-hole. An electrically-conductive material, such as solder, is then applied into the through hole to electrically couple the elongated lead of the leaded component to the electrically-conductive routing feature of the core package.

19 Claims, 3 Drawing Sheets

(56) References Cited

U.S. PATENT DOCUMENTS

| | | | |
|---|---|---|---|
| 2005/0146019 A1* | 7/2005 | Momokawa | 257/698 |
| 2006/0099727 A1* | 5/2006 | Konrad et al. | 438/14 |
| 2007/0122960 A1* | 5/2007 | Aoki | 438/197 |
| 2008/0006943 A1* | 1/2008 | Wakisaka | H01L 23/5389 257/738 |
| 2008/0006947 A1* | 1/2008 | Akiba et al. | 257/778 |
| 2009/0026614 A1* | 1/2009 | Jung | 257/738 |
| 2010/0237485 A1* | 9/2010 | Kim et al. | 257/686 |
| 2011/0108988 A1* | 5/2011 | Lim | H01L 21/76898 257/751 |
| 2012/0145445 A1* | 6/2012 | Arai et al. | 174/260 |
| 2012/0168944 A1 | 7/2012 | Gan et al. | |
| 2013/0147063 A1* | 6/2013 | Park et al. | 257/777 |

\* cited by examiner

US 9,281,284 B2

SYSTEM-IN-PACKAGES HAVING VERTICALLY-INTERCONNECTED LEADED COMPONENTS AND METHODS FOR THE FABRICATION THEREOF

TECHNICAL FIELD

Embodiments of the present invention relate generally to microelectronic packaging and, more particularly, to System-in-Packages and methods for producing System-in-Packages including vertically-interconnected leaded components.

BACKGROUND

A microelectronic package in which a semiconductor die is interconnected with at least one other microelectronic component can be referred to as a "System-in-Package" or, more simply, as an "SiP." In certain cases, it may be desirable to produce an SiP including at least one microelectronic component having a relatively large footprint. In instances wherein the SiP includes a molded body in which one or more semiconductor die have been encapsulated, the Large Footprint (LF) component can be embedded within the molded body along with the semiconductor die. Such an approach, however, results in a significant increase in the overall planform dimensions of the SiP, which may be unacceptable in certain applications. This increase in SiP planform dimensions can be minimized by mounting the LF component to the package frontside or backside in a stacked or three dimensional arrangement. However, rarely is there provided sufficient area on the package frontside to accommodate one or more LF components due to, for example, the presence of a Ball Grid Array (BGA) or other frontside contact array. Conversely, mounting the LF component to the package backside can introduce undesired cost and complexity to manufacturing process in instances wherein interconnection of the LF component requires build-up of one or more Redistribution Layers (RDLs) over the package backside or the formation of one or more Through Package Vias (TPVs) through the package body.

It would thus be desirable to provide SIPs and methods for fabricating SiPs enabling microelectronic components having relatively large footprints to be integrated into a given SiP, while minimizing the planform dimensions thereof. It would also be desirable for such an SiP fabrication method to be relatively straightforward and cost effective to implement. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
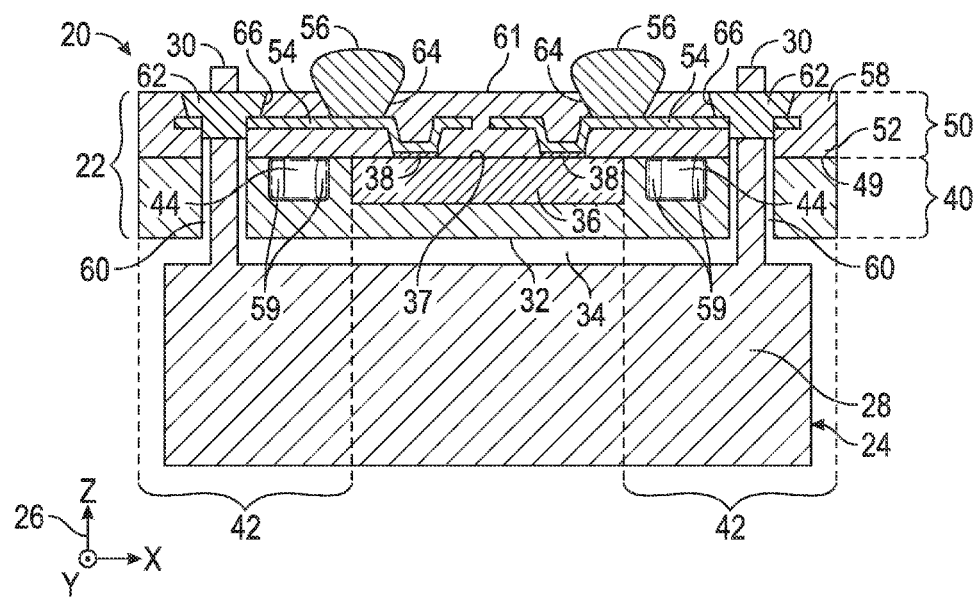
FIG. 1 is a simplified cross-sectional view of a SiP including at least one leaded component, which has a relatively large footprint and which is vertically interconnected with a core package by one or more elongated leads, as illustrated in accordance with an exemplary embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following describes embodiments of SiPs and methods for fabricating SiPs including microelectronic components having elongated, electrically-conductive leads (referred to herein as "leaded components" and also commonly referred to "axial or radial leaded components"). By virtue of the below-described fabrication process, one or more leaded components can be integrated into an SiP without significantly increasing the planform dimensions thereof, even in instances wherein the leaded component or components have relatively large footprints. In preferred implementations, this is accomplished by positioning the leaded component adjacent the backside of a core package in a three dimensional or stacked relationship. The elongated leads of the leaded component are received through or around the core package and pass by sidewall surfaces at which routing features terminate. The sidewall surfaces can be external to the core package (as when the leads are routed around the perimeter of the core package) or internal thereto (as when the leads are directed through via openings, tunnels, or through-holes formed in the package body). The routing features can be, for example, interconnect lines contained within one or more RDLs formed on the frontside of the core package. Electrical interconnections between the sidewall-terminating routing features and the component leads can be completed by applying reflowed solder or another electrically-conductive bridging material between the leads and the surrounding sidewall surfaces to which the routing features extend. In this manner, vertical interconnection between the leaded component and the core package is achieved without requiring the production of backside RDLs, TPVs, or other such structures, which can otherwise add undesired cost and complexity to the manufacturing process. The end result is an SiP having a relatively compact planform dimensions and containing one or more leaded components, which can (but need not always) have relatively large footprints. Additionally, embodiments of the below-described SiP fabrication process can be performed largely or wholly on a molded panel or wafer level to maximize throughput and manufacturing efficiency.

FIG. 1 is a cross-sectional view of a SiP 20, as illustrated in accordance with an exemplary embodiment of the present invention. SiP 20 includes a core package 22 and at least one leaded component 24, which is positioned adjacent package 22 in a stacked or vertically-overlapping relationship; the term "vertical," as appearing herein, defined as a direction substantially parallel to the centerline of core package 22 (corresponding to the Z-axis identified by coordinate legend 26 in FIG. 1). Leaded component 24 includes a component body 28 from which one or more electrically-conductive leads 30 extend. Component body 28 is positioned adjacent the lower principal surface or backside 32 of core package 22. Component leads 30 are directed either around or through the body of core package 22 and utilized to interconnect leaded component 24 with interconnect lines or other electrically-conductive routing features included within package 22. The particular manner in which components leads 30 can be utilized to interconnect the leads 30 of leaded component 24 and the routing features of core package 22 will be described in detail below. First, however, a general description of core package 22 is provided to establish an exemplary context in which SiP 20 can be better understood.

Core package 22 can assume any form and include any number of components desirably interconnected with at least one leaded component to produce a System-in-Package. Core package 22 will typically include at least one Integrated Circuit (IC) carried by one or more semiconductor die. For example, as illustrated in FIG. 1, core package 22 can contain a semiconductor die 36 having a frontside 37 on which one or more ICs have been fabricated during wafer level processing. A number of bond pads 38 is located on frontside 37 of die 36 to provide points-of-contact to the IC or ICs formed thereon. Core package 22 can be produced utilizing various different packaging approaches, including both Fan-In Wafer Level Packaging (FI-WLP) and Fan-Out Wafer Level Packaging (FO-WLP) approaches. In the illustrated exemplary embodiment, core package 22 is produced utilizing a FO-WLP approach such that core package 22 includes a molded body 40 having a fan-out region 42, which extends around or surrounds semiconductor die 36. If desired, additional microelectronic components can also be embedded within molded body 40 along with semiconductor die 36. For example, as further shown in FIG. 1, one or more Surface Mount Devices (SMDs) 44 can be embedded within molded body 40 along with die 36. SMDs 44 can be discrete resistors, capacitors, inductors, diodes, or the like.

SMDs 44 and die 36 are embedded within molded body 40 at a position generally coplanar with an upper principal surface 49 of molded body 40 (referred to herein as a "build-up surface 49"). One or more RDLs 50 are produced over build-up surface 49. RDLs 50 include a dielectric body 52 containing electrically-conductive routing features, such as interconnect lines 54. Dielectric body 52 can be composed of a number of dielectric layers successively deposited over build-up surface 49, and interconnect lines 54 can be plated metal (e.g., copper) traces interspersed with the dielectric layers. In the illustrated example, dielectric body 52 includes an outer solder mask layer 58 over which a BGA comprised of solder balls 56 is produced. Interconnect lines 54 electrically couple terminals 59 of SMDs 44, bond pads 38 of semiconductor die 36, and BGA solder balls 56, as appropriate, to complete the wiring structure of core package 22. In other embodiments, core package 22 and, more generally, SiP 20 can be fabricated to include other types of internal wiring structures and Input/Output (I/O) interfaces including various different combinations of contact arrays (e.g., BGAs, externally-exposed solder pads, stud bumps, Land Grid Arrays, etc.), RDLs, leadframes, interposers, wire bonds, TPVs, and the like. Furthermore, SiP 20 need not include an externally-accessible contact array in all embodiments and can instead communicate wirelessly utilizing, for example, a Radio Frequency (RF) antenna structure. In this latter case, SiP 20 can be powered by an internal battery or by energy harvesting, with either functionality potentially provided by leaded component 24.

Turning now to component 24, leaded component 24 can include or assume the form of any microelectronic device or structure suitable for inclusion within SiP 20 and desirably interconnected with semiconductor die 36 and/or other circuitry contained within core package 22. A non-exhaustive list of microelectronic devices or components suitable for usage as leaded component 24 includes RF shield structures, ground planes, high performance capacitors, small scale batteries, and RF antenna structures, to list but a few examples. Advantageously, many of the aforementioned devices are available as Commercial-Off-The-Shelf (COTS) components, which can be obtained at relatively low cost. Leaded component 24 will often include multiple leads 30, which project vertically from component body 28 toward core package 22. However, leaded component 24 can include any number of leads 30; and, when assuming the form of an RF antenna structure, leaded component 24 may include only a single lead. While SiP 20 includes a single leaded component 24 in the embodiment shown in FIG. 1, it will be appreciate that multiple leaded components 24 can be positioned adjacent core package 22 in a side-by-side or stacked array and interconnected with corresponding routing features provided in or on package 22.

With continued reference to the exemplary embodiment shown in FIG. 1, body 28 of leaded component 24 can contact backside 32 or may instead be offset therefrom by a vertical standoff or gap 34. When present, vertical gap 34 can be left as an unfilled void or instead backfilled with an underfill material. In further embodiments, an adhesive layer (e.g., double-sided tape) can be disposed or an adhesive material (e.g., a die attach material) can be dispensed between component body 28 and backside 32 of core package 22 to further strengthen the mechanical bond between leaded component 24 and package 22. However, in many cases, the solder or other electrically-conductive material utilized to join component leads 30 and core package 22 will provide a sufficiently strong mechanical connection to render the usage of additional bonding material unnecessary. When left as an unfilled air gap or filled with a suitable dielectric material, vertical gap 34 can help reduce RF interference between circuitry contained within core package 22 (e.g., the IC carried by die 36) and leaded component 24 in implementations wherein component 24 is an RF antenna structure or similar device.

The package architectures described herein are particularly useful when the leaded component or components integrated into the System-in-Package have relatively large footprints. Leaded component 24 and, more specifically, component body 28 will thus often have planform dimensions exceeding the planform dimensions of die 36 and, perhaps, approaching or exceeding the planform dimensions of core package 22. In many embodiments, at least one planform dimension of leaded component 24 (e.g., a length, width, or diameter of component body 28) will be at least one half the corresponding planform dimension (e.g., length or width) of core package 22. In the exemplary embodiment shown in FIG. 1, specifically, component body 28 has a width (taken along the X-axis identified by coordinate legend 26) that is substantially equivalent to and possibly exceeds the width of core package 22. The length of component 24 can likewise approach or exceed the length of core package 22, as taken along the Y-axis in FIG. 1. The foregoing examples notwithstanding, leaded component 24 can assume any particular shape or size, providing that component 24 includes at least one elongated lead 30 amenable to interconnection with core package 22 in the below-described manner.

In embodiments wherein component 24 has a relatively large footprint, leaded component 24 generally cannot be embedded within molded body 40 at a position laterally adjacent die 36 or SMDs 44 without significantly increasing the planform dimensions of SiP 20. Furthermore, due to the presence of BGA solder balls 56, sufficient area may not be allotted on the upper principal surface or frontside 61 of core package 22 to accommodate leaded component 24, while maintaining the planform dimensions of SiP 20. By disposing component body 28 adjacent the backside 32 of core package 22, leaded component 24 can be integrated into SiP 20 while avoiding or minimizing any increase in the overall planform dimensions of SiP 20. At the same time, the need to produce backside RDLs, TPVs, or other such backside interconnection structures is avoided by leveraging the elongated leads 30 of component 24 to provide electrically-conductive paths extending toward and possibly to frontside 61 of core package 22. To permit such vertical interconnection, component leads 30 can be routed either through or around core package 22 and electrically interconnected with routing features included within package 22. For example, component leads 30 can be routed around the perimeter of core package 22 and interconnected with interconnect lines or other routing features extending to the outer package sidewalls. Alternatively, as indicated in FIG. 1, component leads 30 can be routed through tunnels, via openings, or through-holes 60 formed at selected locations in core package 22 and interconnected with selected interconnect lines 54 extending to the sidewall surfaces of through-holes 60. As further described below, electrically-conductive bodies 62 can be formed in through-holes 60 to complete the desired interconnections between component leads 30 and the regions of interconnect lines 54 extending to the package sidewall surfaces defining through-holes 60.

In the exemplary embodiment shown in FIG. 1, through-holes 60 are formed in fan-out regions 42 of molded body 40 and, perhaps, on opposing sides of semiconductor die 36. Through-holes 60 extend from backside 32 to frontside 61 of package 22 and, therefore, through fan-out regions 42 and the overlying regions of RDLs 50. Die 36 is thus located between through-holes 60 and component leads 30 and vertically overlaps with component body 28, as taken along an axis substantially orthogonal with frontside 61 and backside 32 of core package 22 (corresponding to the Z-axis in coordinate legend 26). In embodiments wherein through-holes 60 are produced to have substantially circular planform geometries, the diameters of through-holes 60 will typically be slightly larger than the diameters of component leads 30. In one embodiment, and by way of non-limiting example only, through-holes 60 are formed to have diameters ranging from about 250 to about 450 microns; the term "about" utilized herein to denote a disparity of 10% or less. Through-holes 60 will typically be formed to extend along axes substantially parallel to the centerline of SiP 20 (corresponding to the Z-axis identified by coordinate legend 26); however, the possibility that through-holes 60 can be formed at slanted or oblique angles is by no means precluded. As indicated in FIG. 1, through-holes 60 can connect to solder mask openings 66 produced during patterning of solder mask layer 58, as described below in conjunction with FIG. 6.

Electrically-conductive bodies 62 can be produced by first depositing discrete bodies or globs of solder over the frontside openings of through-holes 60 and then performing a solder reflow process to apply or direct the solder into through-holes 60. Wicking of solder into through-holes 60 can be urged by capillary action during reflow. Additionally, as interconnect lines 54 are composed of copper or other solder-wettable alloy, the regions of interconnect lines 54 exposed through or at solder mask openings 66 can further promote the inflow of solder into through-holes 60. During the reflow process, SiP 20 is heated to sufficient reflow temperature to melt the solder, which inflows into through-holes 60 and bonds with the exposed regions of interconnect lines 54 and the neighboring portions of components leads 30. If desired, a common solder reflow process can be performed for both electrically-conductive bodies 62 and BGA solder balls 56 to improve manufacturing efficiency. When produced by deposition and reflow of solder, electrically-conductive bodies 62 may penetrate only partially into through-holes 60 as the RDL dielectric material will typically be non-solder-wettable. However, partial penetration or inflow of the reflowed solder into through-holes 60 is sufficient to produce the desired interconnections in the exemplary embodiment shown in FIG. 1. Such an approach is usefully employed when it is desired to form electrical connections between leads 30 and interconnect lines 54 defined by patterning of the sole or outermost metal level included within RDLs 50. In further embodiments, electrically-conductive material other than solder can be deposited or applied into through-holes 60 to form the desired electrical connections. For example, in certain embodiments, an electrically-conductive paste or metal-filled epoxy can be dispensed into through-holes 60 utilizing, for example, a needle dispensing or screen printing process.

By virtue of the above-described construction, at least one leaded component 24 having a relatively large footprint is incorporated into SiP 20 without a significant increase in the planform dimensions thereof. As an additional benefit, fabrication of SiP 20 can be performed on a panel level, at least in substantial part, to allow a relatively large number of SiPs to be produced in parallel with SiP 20. An exemplary embodiment of a manufacturing method suitable for producing SiP 20 along with a number of other SiPs will now be described in conjunction with FIGS. 2-7. As shown in FIGS. 2-7 and described further below, the fabrication method is offered by way of non-limiting example only. It is emphasized that the fabrication steps shown in FIGS. 2-7 can be performed in alternative orders, that certain steps may be omitted in alternative embodiments, and that additional steps may be performed in alternative embodiments. Description of structure and processes known within the microelectronic package industry may be limited or entirely omitted without providing the well-known process details. In keeping with the exemplary embodiment shown in FIG. 1, core package 22 is described below as produced utilizing FO-WLP approach. It is emphasized, however, the core package or packages included within SiP 20 can be produced utilizing other types of packaging approaches in further embodiments. For example, in certain embodiments, the core packages can be produced utilizing a FI-WLP approach during which the below-described process steps are performed on a wafer level; that is, utilizing non-singulated semiconductor wafer as opposed to a molded panel containing a number of singulated semiconductor die.

Figure 2:
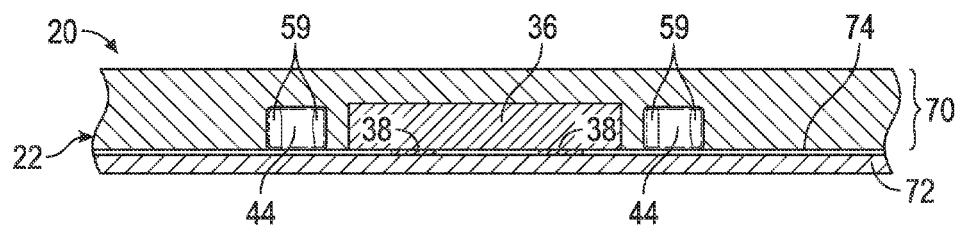
FIGS. 2-7 are cross-sectional views of the SiP shown in FIG. 1, as illustrated at various stages of manufacture and produced in accordance with an exemplary fabrication method.
Figure 3:
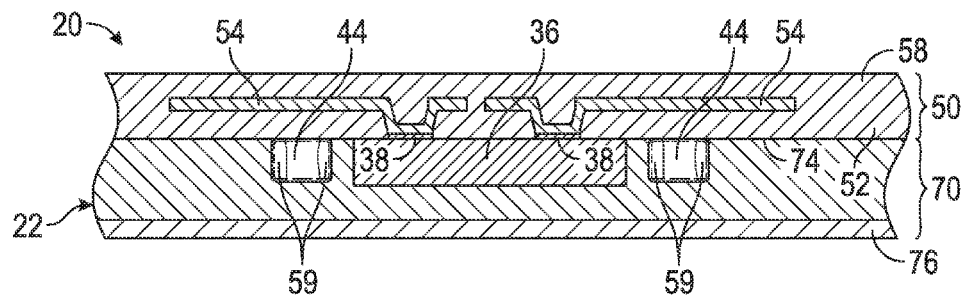

With reference to FIG. 2, fabrication of SiP 20 can commence with production of core package 22. Core package 22 remains in panel form at the stage of manufacture shown in FIG. 2 and is consequently interconnected with a number of other partially-completed core packages (not shown) as a unitary or non-singulated molded panel 70. To avoid unnecessarily obscuring the drawing, a relatively limited portion of molded panel 70 is shown in FIG. 2 corresponding to partially-completed core package 22 and, more generally, SiP 20. Molded panel 70 will typically be considerably larger than the illustrated portion and will contain various additional microelectronic devices (e.g., other die and SMDs) incorporated into the other SiPs produced in parallel with SiP 20. The other SiPs produced in parallel with SiP 20 may or may not be substantially identical to SiP 20. By way of non-limiting example, one process suitable for fabricating molded panel 70 can be performed as follows. First, semiconductor die 36, SMDs 44, and the other non-illustrated die and SMDs are placed facedown on temporary substrate 72 using, for example, a pick-and-place tool. A non-illustrated mold frame having a central cavity or opening therein is then positioned over substrate 72 and around the microelectronic components. An electrically-insulative encapsulant or mold compound, such as a silica-filled epoxy, is then dispensed into the cavity of the mold frame and flows over the microelectronic components. The encapsulant is solidified by thermal curing to yield panel 70 in which die 36, SMDs 44, and the other non-illustrated microelectronic components are embedded. In further embodiments, panel 70 can be produced utilizing various other known fabrication techniques including, for example, compression molding and lamination processes.

Figure 4:
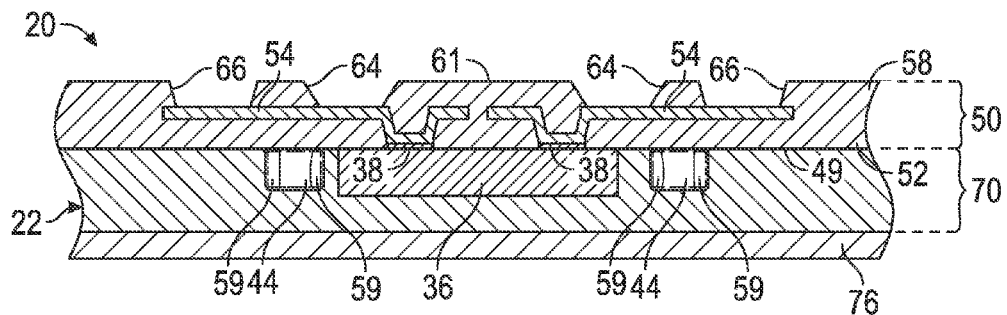

After encapsulation, molded panel 70 can be thermally released or otherwise removed from temporary substrate 72 to reveal the frontside 74 of panel 70. Bond pads 38 of semiconductor die 36 are exposed at the frontside of molded panel 70, as are the terminals 59 of SMDs 44. Molded panel 70 is then inverted and attached to a support structure, such as a ceramic carrier 76 (shown in FIG. 3). With frontside 74 of molded panel 70 facing upwards, RLDs 50 can now be built-up over molded panel 70. During build-up of RDLs 50, dielectric body 52 can be produced by spinning-on or otherwise depositing one or more dielectric layers over panel frontside 74. Interconnect lines 54 are produced within dielectric body 52 utilizing well-known lithographical patterning and conductive material deposition techniques. In one embodiment, interconnect lines 54 are produced by patterning a mask layer deposited over a seed layer, plating exposed regions of the seed layer with copper or another metal, and then removing the mask layer to define interconnect lines 54. After build-up of RDLs 50, solder mask openings 64, 66 are formed in solder mask layer 58 by lithographical patterning. A first group of solder mask openings 64 are formed to expose selected regions of interconnect lines 54 for contact with the subsequently-formed BGA solder balls 56. A second group of solder mask openings 66 is also formed at the overlapping with the subsequently formed through-holes 60. The resultant structure is shown in FIG. 4.

Figure 5:
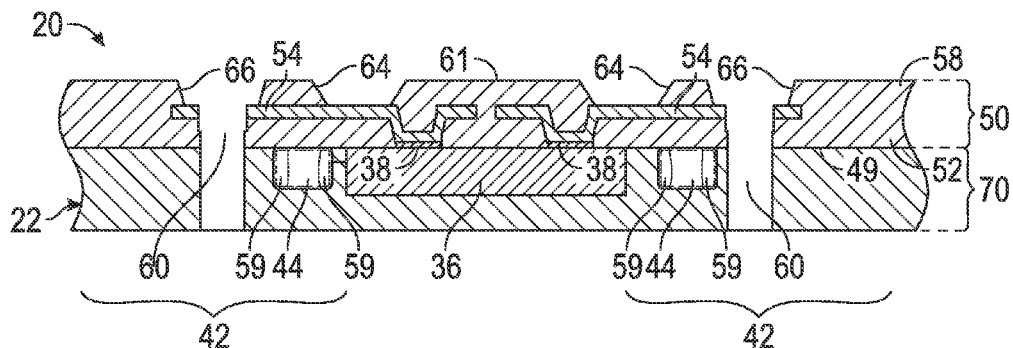

Advancing to FIG. 5, through-holes 60 are next formed through core package 22 and, more generally, through molded panel 70 by mechanical drilling, laser drilling, punching, or another suitable material removal process. In one embodiment, molded panel 70 is first removed from ceramic carrier 76 (shown in FIG. 4), secured to the chuck table of a drilling machine (not shown), and placed under vacuum to maintain panel 70 in a flat state. Through-holes 60 are then drilled through panel 70 and, therefore, through core package 22 at the selected locations. For example, as shown in FIG. 5, through-holes 60 can be formed through fan-out regions 42 and the overlying regions of RDLs 50. Removal of material from panel 70 and core package 22 imparts package 22 with inner sidewall surfaces, which define through-holes 60 to which certain interconnect lines 54 extend. Portions of interconnect lines 54 can also be removed during the material removal process such that interconnect lines 54 extend to and are exposed at the inner sidewall surfaces defining through-holes 60 to facilitate interconnection with leaded component 24, as described below.

Figure 6:
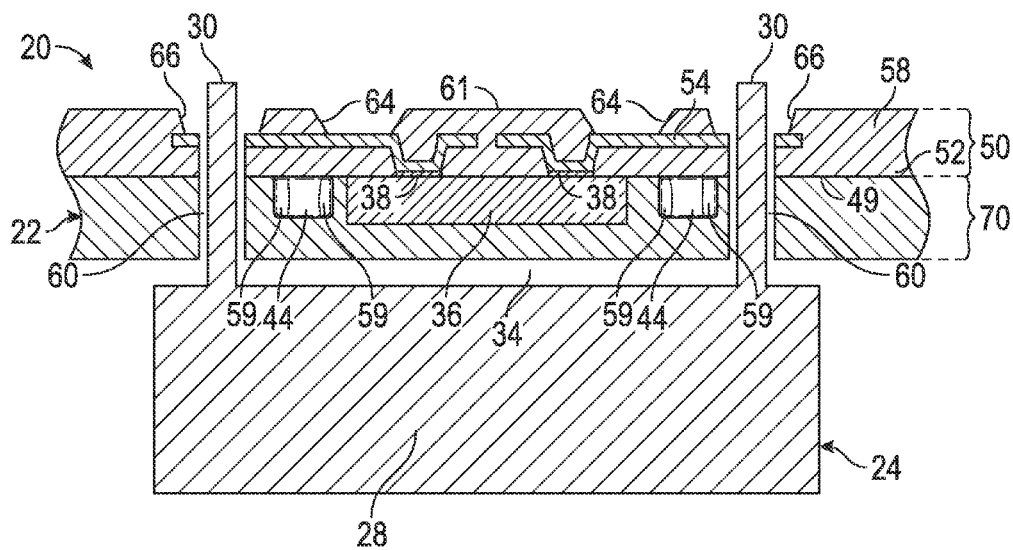

With reference to FIG. 6, leaded component 24 is next positioned adjacent backside 32 of core package 22 such that component leads 30 are received in their corresponding through-holes 60. During placement of component 24, component body 28 is brought into proximity with backside 32 of core package 22 such that leads 30 are inserted through the backside openings of through-holes 60. As indicated in FIG. 6, component leads 30 can extend entirely through-holes 60 to frontside 61 of core package 22; however, this need not always be the case. If projecting undesirably far beyond frontside 61 of core package 22, component leads 30 can be trimmed or bent flat against frontside 61 of package 22. Bending of component leads 30 against frontside 61 can also help retain leaded component 24 in its desired position relative to core package 22. Additional leaded components can likewise be positioned adjacent the respective backsides of the other SiPs formed across molded panel 70. In one embodiment, leaded component 24 and the other non-illustrated leaded components are placed in their desired positions individually utilizing a pick-and-place tool or collectively utilizing a specialized fixture.

Figures 7, 8:
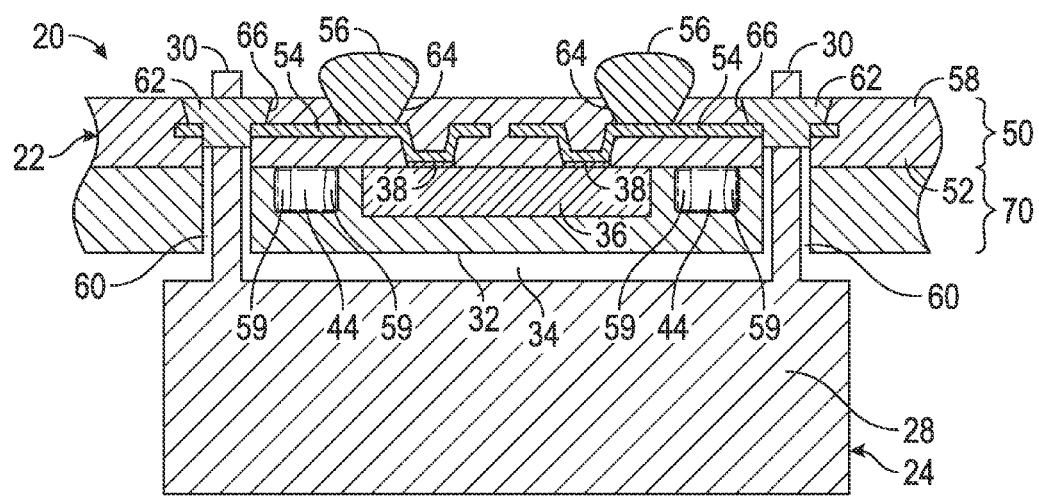
FIG. 8 is a cross-sectional view of a SiP including a core package and at least one leaded component, which has a relatively large footprint and which is vertically interconnected with a core package by one or more elongated leads, as illustrated in accordance with a further exemplary embodiment of the present invention.

Continuing with the exemplary manufacturing process shown in FIGS. 2-7, a chosen electrically-conducive bridging material is next applied or directed into the upper portions of through-holes 60 extending through RDLs 50 to complete the desired interconnections between component leads 30 and RDL interconnect lines 54. For example, as indicated above, discrete bodies or globs of solder can be deposited into or over solder mask openings 66, and solder reflow can then be carried-out to yield electrically-conductive bodies 62. If desired, BGA solder balls 56 can be first deposited into solder mask openings 64 and a common heat treatment process can be performed to reflow both solder balls 56 and electrically-conductive bodies 62. As shown in FIG. 7, solder flows into the frontside openings of through-holes 60 to form bodies 62 due, at least in part, to the solder-wettable nature of the metal (e.g., copper) from which interconnect lines 54 are formed. This results in the application of solder to the inner sidewall surfaces of core package 20, which define through-holes 60 and to which interconnect lines 54 extend. In this particular example, solder does not fully fill through-holes 60 due to the limited volume of solder deposited and the non-wettable nature of the RDL dielectric material; however, the ingress of solder (and, therefore, the formation of bodies 62) into an upper portion of through-holes 60 is adequate to complete the desired interconnections between component leads 30 and RDL interconnect lines 54. Afterwards, molded panel 70 is singulated to separate SiP 20 and the other SiPs into discrete units. Singulation is carried-out utilizing a dicing saw; however, other singulation processes can also be utilized including, for example, laser cutting. The resultant structure is shown in FIG. 1 wherein the singulated piece of panel 70 now forms the above-described molded body 40 of SiP 20.

There has thus been provided an exemplary embodiment of a method for fabricating SiPs enabling the integration of microelectronic components having relatively large footprints, while minimizing the overall the planform dimensions of the SiPs and their associated fabrication costs. As described above, the elongated leads of the leaded component can be inserted into through-holes formed at selected locations in the package body and exposing RDL interconnect lines, which are electrically coupled to the component leads by, for example, the reflow of solder into the through-holes. In the above-described exemplary embodiment, partial ingress of the reflowed solder into the through-holes (and, therefore, application of the solder to inner through-hole surfaces) is sufficient to produce the desired interconnections between the component leads and interconnect lines contained within the outermost or only patterned metal level. In further embodiments wherein it is desired to establish electrical connection between the component leads and electrically-conductive structures located beneath the outermost patterned metal level, the through-holes can be plated with an electrically-conductive, solder-wettable alloy to promote greater penetration of the solder into the through-holes during reflow. To further emphasize this point, an exemplary embodiment of a System-in-Package including such plated through-holes will now be described in conjunction with FIG. 8.

FIG. 8 is a cross-sectional view of a SiP 90, as illustrated in accordance with a further exemplary embodiment of the present invention. SiP 90 is similar to SiP 20 described above in conjunction with FIGS. 1-7. SiP 90 includes a core package 92 having a frontside 94 and an opposing backside 96. Core package 92 contains a semiconductor die 95 and a number of additional microelectronic components (e.g., SMDs 97), which are embedded within an encapsulant or molded body 98 along with die 95. One or more RDLs 100 are formed over the build-up surface of molded body 98 and contain a plurality of interconnect lines 102. BGA solder balls 104 are formed over the RDLs 100 and in contact with selected regions of interconnect lines 102 to enable electrical communication with the devices contained within core package 92. Tunnels, bores, or through-holes 106 are formed through core package 92 and, specifically, through RDLs 100 and the fan-out region of molded body 98. As was previously the case, at least one leaded component 108 is disposed adjacent backside 96 of core package 92. Leaded component 108 includes a component body 110 and a number of elongated leads 112, which extend outwardly from body 110 and are received by through-holes 106. Electrically-conductive bodies 114 are once again formed in through-holes 106 to form the desired electrical connections between elongated leads 112 and the regions of interconnect lines 102 extending to through-holes 106.

SiP 90 differs from SiP 20 (FIGS. 1-7) in two primary respects. First, through-holes 106 have been plated with an electrically-conductive, solder-wettable alloy layer 116 (referred to herein as "through-hole plating 116") to yield plated through-holes 106, 116. Second, due to the presence of through-hole plating 116, and the provision of a larger volume of solder, electrically-conductive bodies 114 fill the majority and, perhaps, the substantial entirety of through-holes 116. This enables the formation of electrical connection between component leads 112 and interconnect lines 102 located beneath the outermost patterned metal level of RDLs 100. Additionally, this enables electrical connections to be established between component leads 112 and other structures, devices, or components embedded within molded body 98 and exposed by through-holes 106. For example, as shown in right hand side of FIG. 8, an Embedded Ground Plane (EGP) 118 can be embedded within molded body 98 and electrically coupled to one or more component leads 112 via electrically-conductive bodies 114.

The foregoing has thus provided embodiments of SiPs and methods for fabricating SiPs enabling the integration of microelectronic components having relatively large footprints, while minimizing the overall planform dimensions of the SiP. In at least some embodiments, this is accomplished by positioning one or more leaded components over a core package in a three dimensional or stacked relationship and routing the elongated leads of the component through or around the core package. In the above-described exemplary embodiments, specifically, the leads of the leaded components are inserted into through-holes formed at selected locations in the package body and exposing RDL interconnect lines, which are electrically coupled to the component leads by, for example, the reflow of solder into the through-holes. In further embodiments, the component leads may not be received by through-holes formed in the core package and can instead extend along the outer sidewall surfaces of the core package to provide the desired interconnections. In either case, interconnection between the leaded component and the circuitry within the core package can be achieved without requiring the production of backside RDLs, TPVs, and other such structures, which can otherwise add significant complexity and cost to the manufacturing process. Additionally, in embodiments wherein the core package includes a molded body, the component leads can be electrically connected to other electrically-conductive routing features embedded within the molded body, such as an EGP.

In one embodiment, the above-described SiP fabrication method includes the step or process of forming a through-hole in a core package, the core package containing an electrically-conducive routing feature exposed at a sidewall surface of the through-hole. A leaded component is positioned adjacent the core package such that an elongated lead of the leaded component extends into the through-hole. An electrically-conductive material, such as solder, is then applied into the through hole to electrically couple the elongated lead of the leaded component to the electrically-conductive routing feature of the core package.

In a further embodiment, the method includes the step or process of providing a core package comprising a molded body, a semiconductor device embedded in the molded body, and one or more redistribution layers formed over a molded body. The core package can be provided by independent fabrication or obtained from a third party supplier. At least one through-hole is produced in the core package and extends through the redistribution layers to expose at least one interconnect line contained therein. The lead of a microelectronic component is inserted into the through-hole. Solder is then deposited over the through-hole and heated to reflow temperature sufficient to cause inflow the solder into the through-hole and thereby form an electrical connection between the lead and the interconnect line.

In a still further embodiment, the method includes the step or process of providing a core package comprising a molded body, a semiconductor die embedded in the molded body, and one or more RDLs formed over a molded body. A leaded component is positioned adjacent the core package such that an elongated lead of the leaded component extends through or around the molded body and adjacent the RDLs. An electrically-conductive material is then applied between the elongated lead of the leaded component and an interconnect line contained within the RDLs to electrically couple the leaded component and the semiconductor die.

Embodiments of a SiP have also been provided. In one embodiment, the SiP includes a core package and a leaded component. The core package includes, in turn, a frontside surface, a backside surface opposite the frontside surface, a through-hole formed in the core package and extending from the frontside surface to the backside surface, and an electrically-conductive routing feature extending to through-hole. The microelectronic component includes a component body, which is positioned adjacent the backside surface of the core package, and a first lead, which extends from the component body into the through-hole. An electrically-conductive material, such as reflowed solder, is disposed at least partially within the through-hole and electrically coupling the first lead to the interconnect line.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes can be made in the function and arrangement of elements described in an exemplary embodiment without departing from the scope of the invention as set-forth in the appended claims.

As appearing in the foregoing Detailed Description, terms such as "comprise," "include," "have," and the like are intended to cover non-exclusive inclusions, such that a process, method, article, or apparatus that comprises a list of elements is not necessarily limited to those elements, but can include other elements not expressly listed or inherent to such process, method, article, or apparatus. As still further appearing herein, terms such as "over," "under," "on," and the like are utilized to indicate relative position between two structural elements or layers and not necessarily to denote physical contact between structural elements or layers. Thus, a first structure or layer can be described as fabricated "over" or "on" a second structure, layer, or substrate without indicating that the first structure or layer necessarily contacts the second structure, layer, or substrate due to, for example, presence of one or more intervening layers. As appearing further herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, Microelectromechanical Systems (MEMS) devices, passive electronic components, optical devices, and other small scale electronic devices capable of providing processing, memory, sensing, radiofrequency, optical, and actuator functionalities, to list but a few examples.

What is claimed is:

1. A method for producing a System-in-Package, the method comprising:
providing a core package comprising a molded body, a semiconductor die embedded in the molded body, and one or more Redistribution Layers (RDLs) formed over a molded body;
forming a through-hole in the core package, the through-hole having a first portion extending through the RDLs and having a second portion extending through the molded body;
positioning a leaded component adjacent the core package such that an elongated lead of the leaded component extends into the through-hole; and
applying an electrically-conductive material between the elongated lead of the leaded component and an interconnect line contained within a sole or an outermost metal level of the RDLs to electrically couple the leaded component and the semiconductor die, the electrically-conductive material applied in sufficient volume to at least partially fill the first portion of the through-hole formed through the RDLs, while preventing ingress of the electrically-conductive material into the second portion of the through-hole formed through the molded body.

2. The method of claim 1 wherein applying comprises:
depositing solder over the through-hole; and
heating the solder to a reflow temperature to inflow the solder into the through-hole and electrically couple the elongated lead and the interconnect line.

3. The method of claim 2 further comprising plating the through-hole with an electrically-conductive, solder-wettable material prior to depositing the solder.

4. The method of claim 1 wherein the core package has a frontside and an opposing backside, wherein the leaded component comprises a component body, and wherein positioning comprises positioning the component body adjacent the backside of the core package.

5. The method of claim 4 wherein positioning comprises disposing the component body at a location vertically overlapping with the semiconductor die.

6. The method of claim 4 wherein positioning comprises positioning the leaded component adjacent the core package such that component body is separated from the backside of the core package by vertical gap.

7. The method of claim 4 wherein the through-hole extends from the frontside to the opposing backside of the core package along a substantially vertical axis.

8. The method of claim 1 further comprising selecting the leaded component from the group consisting of a Radio Frequency antenna structure and a Radio Frequency shield structure.

9. The method of claim 1 further comprising plating the through-hole with a solder-wettable, electrically-conductive alloy to produce a plated through-hole, and wherein applying comprises reflowing solder into the plated through-hole.

10. The method of claim 9 wherein the core package further comprises an embedded ground plane embedded within the molded package body and exposed at the sidewall surface, and wherein reflowing comprises reflowing the solder to electrically couple the embedded ground plane and the elongated lead.

11. The method of claim 1 wherein the through-hole comprises a frontside opening and a backside opening, wherein inserting comprises inserting the elongated lead into the through-hole through the backside opening, and wherein applying comprises directing an electrically-conductive material into the frontside opening of the through-hole.

12. The method of claim 1 wherein the molded body has a fan-out region surrounding the semiconductor die, and wherein forming comprises producing the through-hole to extend through the RDLs and through the fan-out region.

13. The method of claim 1 wherein the steps of forming, positioning, and applying are performed while the core package remains interconnected with a plurality of other core packages produced across a molded panel, and wherein the method further comprises singulating the molded panel to separate the core package from the plurality of other core package after applying the electrically-conductive material into the through-hole.

14. The method of claim 1 wherein forming comprises drilling the through-hole through the at least one RDL and through the molded panel at a location intersecting the interconnect line such that a portion of the interconnect line is removed by drilling.

15. A System-in-Package (SiP), comprising:
a core package, comprising:
a frontside surface;
a backside surface opposite the frontside surface;
a molded body having a fan-out region;
a semiconductor die embedded in the molded body and surrounded by the fan-out region;
at least one Redistribution Layer (RDL) formed over the molded body;
a first through-hole formed in the core package, the first through-hole having a first portion extending through the at least one RDL and having a second portion extending through the fan-out region of the molded body; and an interconnect line contained in the at least one RDL, electrically coupled to the semiconductor die, and terminating at a sidewall of the first through-hole;

a leaded component, comprising:

a component body positioned adjacent the backside surface of the core package; and a first lead extending from the component body into the first through-hole; and an electrically-conductive material electrically coupling the first lead to the interconnect line, the electrically-conductive material at least partially filling the first portion of the first through-hole, while not entering the second portion of the first through-hole.

16. The SiP of claim 15 wherein the electrically-conductive material comprises reflowed solder.

17. The SiP of claim 15 wherein the leaded component is selected from the group consisting of a Radio Frequency antenna structure and a Radio Frequency shield structure.

18. The SiP of claim 15 wherein molded body comprises a singulated piece of a molded panel from which material has been selectively removed to produce the through-hole along with a plurality of other through-holes.

19. The SiP of claim 15 wherein the core package further comprises a second through-hole formed through the at least one RDL and through the fan-out region of the molded body, wherein the leaded component comprises a second lead extending from the component body into the second through-hole, and wherein the semiconductor die is located between the first and second through-holes, is located between the first and second leads, and vertically overlaps with the component body, as taken along an axis orthogonal with the frontside surface of the core package.

* * * * *